United States Patent
Chiba

(10) Patent No.: US 6,357,650 B1
(45) Date of Patent: Mar. 19, 2002

(54) METHOD OF WIRE-BONDING BETWEEN PAD ON SEMICONDUCTOR CHIP AND PAD ON CIRCUIT BOARD ON WHICH THE SEMICONDUCTOR CHIP IS MOUNTED

(75) Inventor: Hidekazu Chiba, Miyagi (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/717,099

(22) Filed: Nov. 22, 2000

Related U.S. Application Data

(62) Division of application No. 09/455,768, filed on Dec. 7, 1999, now Pat. No. 6,173,879.

(30) Foreign Application Priority Data

Feb. 16, 1999 (JP) ............................................. 11-37368

(51) Int. Cl.[7] ................................................. B23K 1/06
(52) U.S. Cl. ................................... 228/180.5; 228/212
(58) Field of Search .............................. 228/178, 179.1, 228/180.5, 212, 213, 1.1, 13, 44.3, 44.7

(56) References Cited

U.S. PATENT DOCUMENTS

| | | | | |
|---|---|---|---|---|
| 4,181,392 A | * | 1/1980 | Casler et al. ................. 339/95 |
| 4,213,556 A | * | 7/1980 | Persson et al. ............. 228/104 |
| 4,485,957 A | * | 12/1984 | Sugimoto et al. ............ 228/4.5 |
| 4,489,231 A | * | 12/1984 | Luetzow ..................... 219/137 |
| 4,962,918 A | * | 10/1990 | Yang ........................... 269/156 |
| 5,201,453 A | * | 4/1993 | Amador et al. ............. 228/110 |
| 5,207,786 A | * | 5/1993 | Kawashimo ................ 228/179 |
| 5,616,261 A | * | 4/1997 | Forrest .................. 219/121.63 |
| 5,744,773 A | * | 4/1998 | Van Otteren et al. ......... 219/50 |
| 6,000,599 A | * | 12/1999 | Ball et al. ................ 228/180.5 |

* cited by examiner

*Primary Examiner*—Tom Dunn
*Assistant Examiner*—Jonathan Johnson
(74) *Attorney, Agent, or Firm*—Junichi Mimura

(57) ABSTRACT

A method of wire-bonding between a pad on a semiconductor chip and a pad on a circuit board on which the semiconductor device is mounted, includes clamping a wire between a pair of clamping electrodes, each having a rectangular main surface, applying a first electric potential to the wire with a torch rod, applying a second electric potential directly to the wire with the clamping electrodes, so as to form a melted ball at a tip of the wire, solidifying the melted ball, unclamping the wire, pressing the solidified ball with a capillary against the pad on the circuit board, vibrating the wire ultrasonically to bond the solidified ball to the pad of the circuit board, moving the wire whose tip is bonded to the pad of the circuit board, with the capillary on the pad of the semiconductor chip, vibrating the wire ultrasonically to bond the wire to the pad of the semiconductor chip, and clamping the wire between the clamping electrodes again, and moving the clamping electrodes away from the pad of the semiconductor chip so as to snap the wire adjacent to the pad of the semiconductor chip.

13 Claims, 5 Drawing Sheets

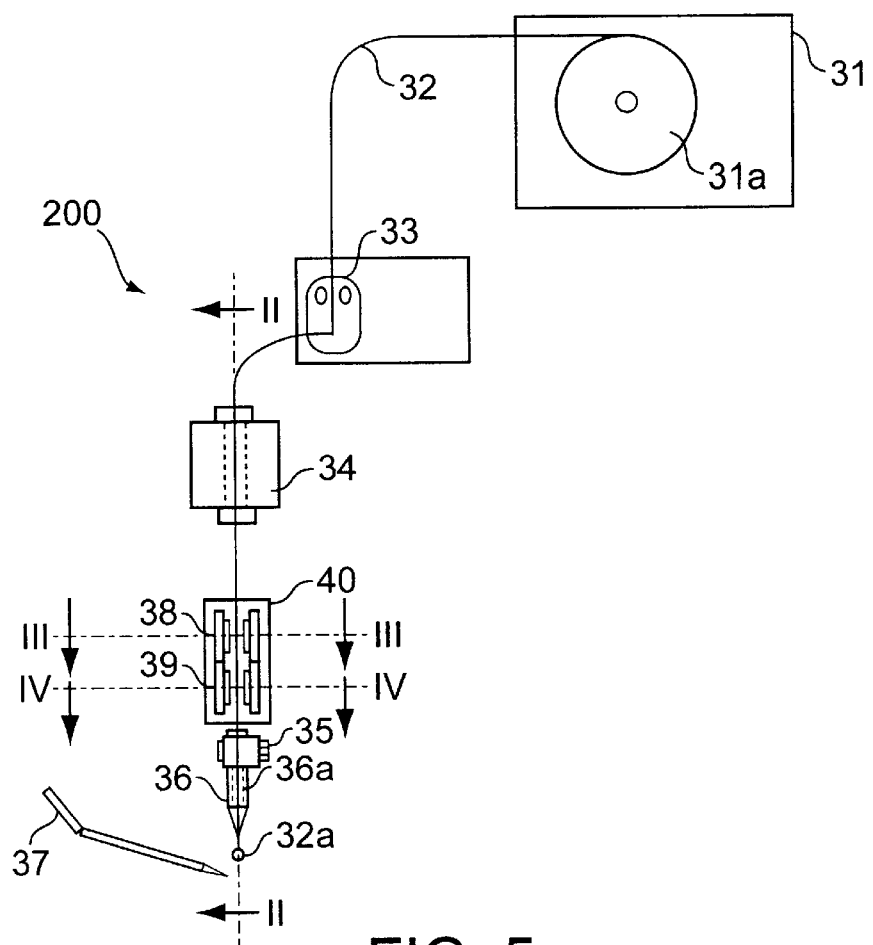
FIG. 5
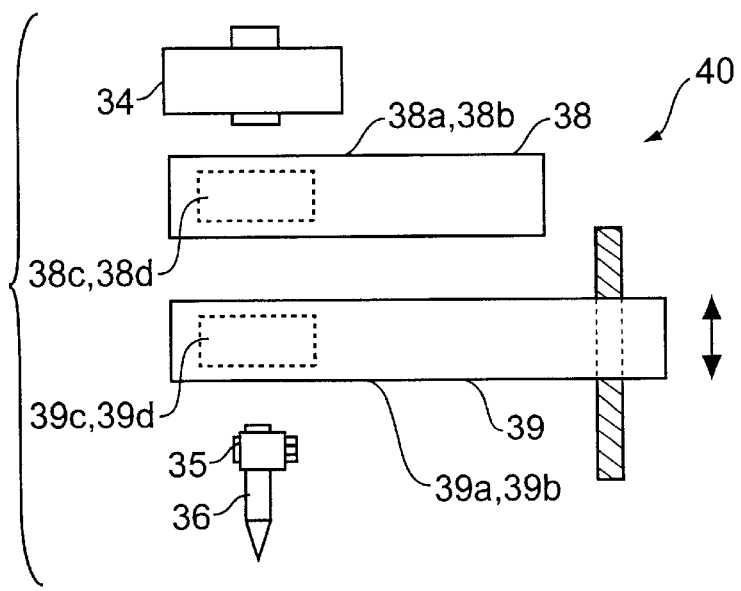
FIG. 6 (II)

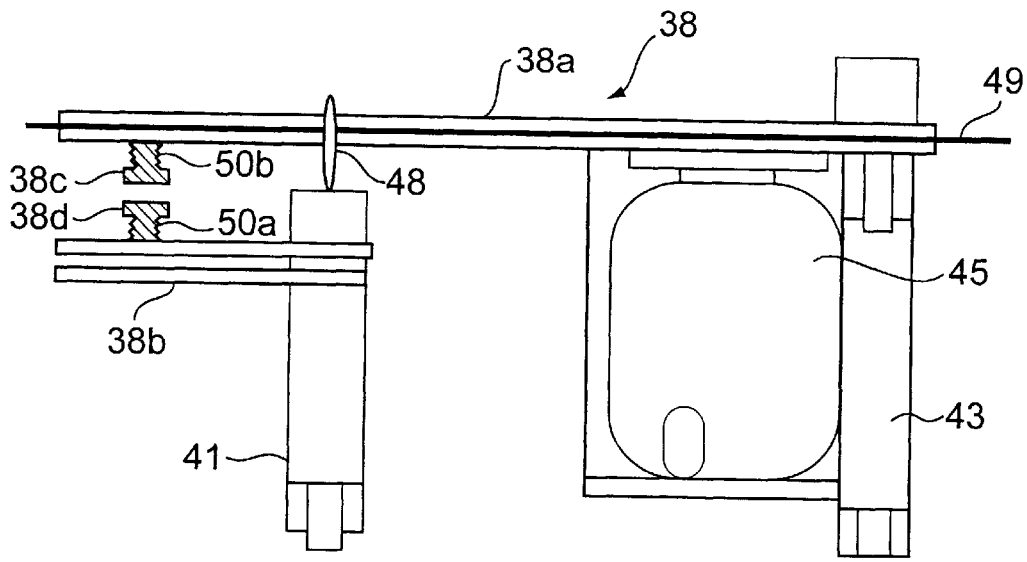
FIG. 7 (III)
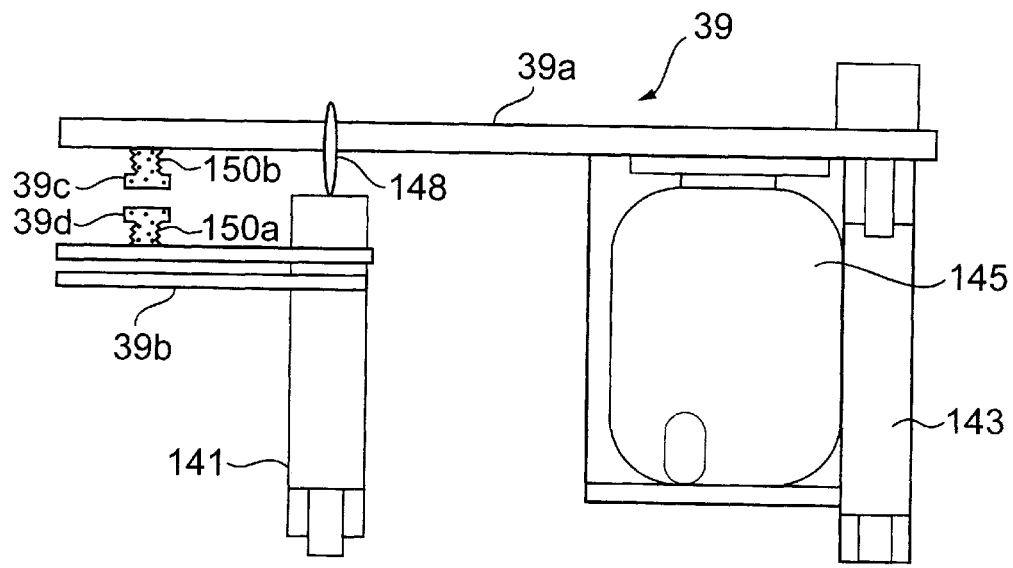
FIG. 8 (IV)

METHOD OF WIRE-BONDING BETWEEN PAD ON SEMICONDUCTOR CHIP AND PAD ON CIRCUIT BOARD ON WHICH THE SEMICONDUCTOR CHIP IS MOUNTED

This application is a divisional of Ser. No. 09/455,768, filed Dec. 7, 1999 now U.S. Pat. No. 6,173,879.

CROSS-REFERENCE TO RELATED APPLICATION

This application claims the priority benefit of Japanese Patent Application No. 11-37368, filed Feb. 16, 1999, the entire subject matter of which is incorporated herein of reference.

BACKGROUND OF THE INVENTION

1. Field of the Invention

The invention relates to a wire bonder which connects a pad on a semiconductor chip with a pad on a circuit board so as to make a looping with a bonding wire.

2. Description of the Related Art

A wire bonder of an ultrasonic thermocompression type includes a pipe-shaped capillary through which a gold bonding wire made of gold can be passed through, a cut damper and a torch rod. The cut damper has a pair of disk-shaped clamping electrodes made of cermet (Cr—SiO), which are placed on parallel plates. The clamping electrodes can clamp the gold bonding wire and apply a fixed electric potential to it.

In a case where a tip of the gold bonding wire is to be connected to a pad on a circuit board, a gold ball should be formed at the tip as the tip exits the end of the capillary. Then, the gold ball is pressed by the tip of capillary against the pad on the circuit board, and is bonded to the pad using an ultrasonic vibration. In a case in which the gold bonding wire connected to the pad on the circuit board at its tip, is to be connected to a pad on a semiconductor chip, the capillary is moved to a position above the pad on the chip. Then, the gold bonding wire is pressed by the tip of capillary against the pad, and is bonded to the pad by applying ultrasonic vibration. After the connection has been completed, the gold bonding wire is clamped by the clamping electrodes of the cut clamper, and is pulled by the cut clamper. The gold bonding wire is cut by tension.

The gold ball is formed using the following method. The gold bonding wire is clamped by the clamping electrodes. Then, by applying an electrical voltage between the electrodes and the torch rod, a melted gold ball is formed by atmospheric discharge against the gold bonding wire as it exits the end of the capillary. Then, the melted gold ball is solidified by cooling.

The circuit board is heated when the gold bonding wire is bonded thereto. Therefore, the gold bonding wire which is pressed by the tip of the capillary is ultrasonically thermocompressed by applying ultrasonic vibration to the gold bonding wire.

However, because the face of the electrode for clamping the gold bonding wire is disk-shaped, if the gold bonding wire is clamped in a position tilted from the axis of disk-shaped electrode, the distance between the end of the electrode and the tip of the gold bonding wire is different from what is desired. Discharge voltage is varied with a parameter of the distance. This may cause the gold ball to be made in various sizes. Additionally, the face of the electrode is worn because of the repetition of the atmospheric discharge. This also causes the gold balls to vary in size. The strength of the gold ball when pressed on the pad depends on its size. Thus, as the size varies so does the bonding strength. Therefore, nonuniformity in gold ball size disadvantageously results in nonuniformity in bonding strength.

Further, the faces of the clamping electrodes should be precisely in parallel to clamp the gold bonding wire. As the result, as electrodes come out of parallel with use, the electrodes must be periodically changed.

SUMMARY OF THE INVENTION

It is an object of the invention to provide an improved wire bonder that corrects the problems mentioned above.

To achieve this object, a wire bonder according to the invention includes a cut damper having a first supporting member, a second supporting member which is opposite the first supporting member, the second supporting member being movable toward and away from said first supporting member, a first clamping electrode connected to the first supporting member, the first clamping electrode having a first rectangular main surface, and a second clamping electrode connected to the second supporting member, the second clamping electrode having a second rectangular main surface which faces the first rectangular main surface in parallel relation thereto.

Further, to achieve the object, the first clamping electrode and the second clamping electrode are rotatably connected to the first supporting member and the second supporting member, respectively. Also, the first and second clamping electrodes have even surfaces, and a heater is incorporated in one of the support members, or in both.

In addition, to further achieve the object, the cut damper is divided into two independent dampers having different functions. The first damper serves to apply an electric potential to the gold bonding wire, and the second damper serves to clamp the gold bonding wire in order to pull the gold bonding wire.

BRIEF DESCRIPTION OF THE DRAWINGS

The invention will be more particularly described with reference to the accompanying drawings, in which:

FIG. 5 is a diagrammatic illustration of a wire bonder for carrying out a second embodiment of the invention;

FIG. 6(II) is cross-sectional view taken on line II—II of FIG. 5;

FIG. 7(III) is cross-sectional view taken on line III—III of FIG. 5; and

FIG. 8(IV) is cross-sectional view taken on line VI—VI of FIG. 5.

DETAILED DESCRIPTION OF THE PREFERRED EMBODIMENT

Figure 1A:
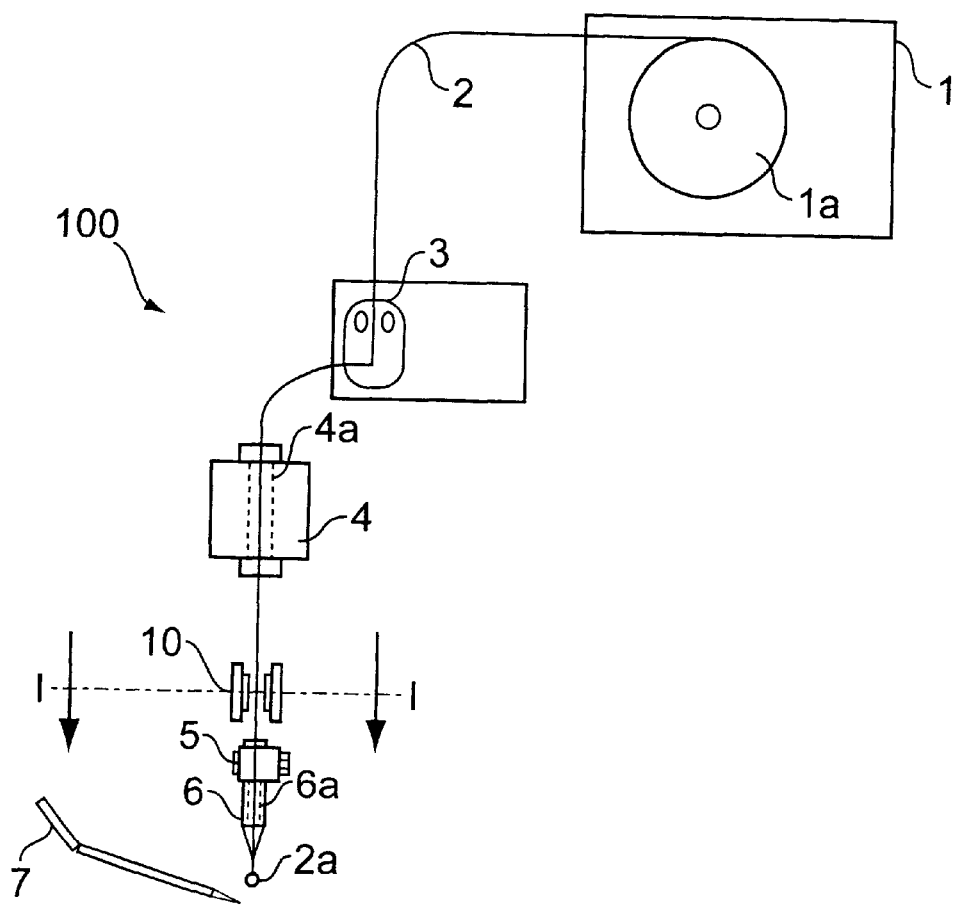
FIG. 1A is a diagrammatic illustration of a wire bonder for carrying out a first embodiment of the invention.

Referring to FIG. 1A, a wire bonder 100 preferably is made up of a spool unit 1 in which a spool 1a is set, a gold bonding wire guide 3, a pipe-shaped air damper 4 having a hole 4a, a transducer 5, a capillary 6 having a center hole 6a, a torch rod 7 and a cut damper 10, which can be moved toward the spool unit 1. A gold bonding wire 2 is spooled on the spool 1a. The gold bonding wire 2 coming from the spool 1a is led by the gold bonding wire guide 3 to pass through the hole 4a in the air damper 4, and it is also passed through the center hole 6a of the capillary 6 which is supported by the transducer 5. The gold bonding wire 2 is stretched with air by the air damper 4 toward the spool 1a. In this wire bonder 100, the transducer 5 has two main functions. One is to move the capillary 6 so as to let its tip press against the pad on the circuit board or the pad on the chip. The other function is to apply ultrasonic vibration to the capillary 6. The torch rod 7 is disposed adjacent the tip of the capillary 6, and the cut damper 10 is disposed between the capillary 6 and the air damper 4.

Figure 2A:
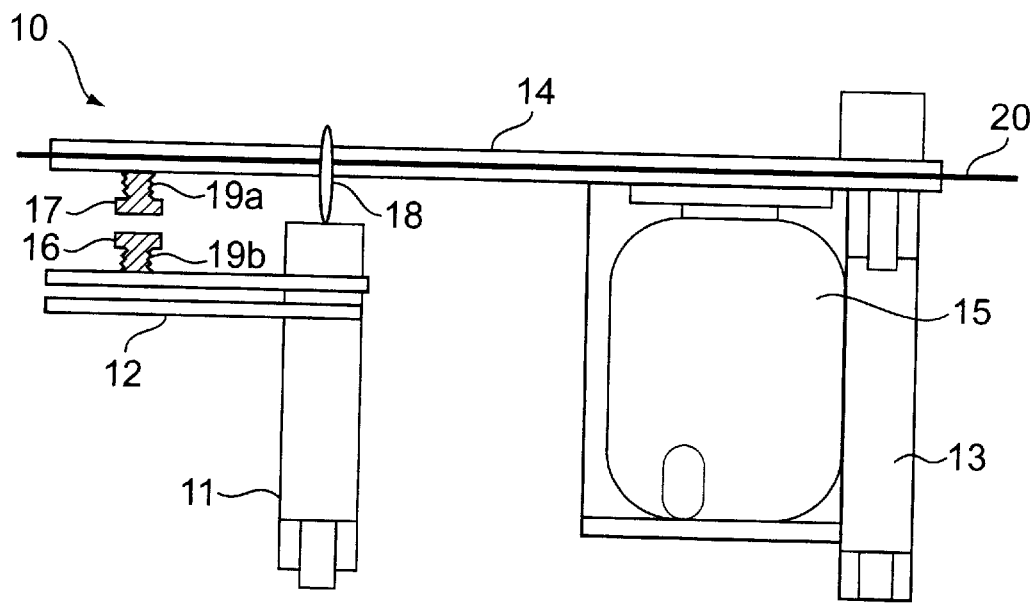
FIG. 2A(I) is a cross-sectional view taken on line I—I of FIG. 1A.
Figure 2B:
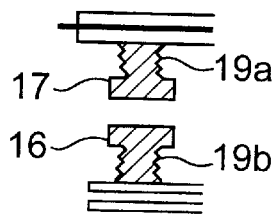
FIG. 2B is an enlarged detail illustration of the tip of the cut clamper.

FIG. 2A(I) shows the structural details of the cut camper 10. Referring to FIG. 2A(I), the cut damper 10 has a fixed plate 12 that is fixed to a shaft 11, and a movable plate 14 that is fixed to a elastic shaft 13 that can expand and contract. The fixed plate 12 and the movable plate 14 are disposed in parallel. A distance between the fixed plate 12 and the movable plate 14 can be changed by a solenoid 15. That is, the movable plate 14 can be moved toward and away from the fixed plate 12. The cut clamper 10 also has a pair of clamping electrodes 16, 17 made of cermet. As shown in FIG. 2B, the electrode 16 is connected to the fixed plate 12 by a screw 19a and the electrode 17 is connected to the movable plate 14 by a screw 19b. Therefore, the electrodes can be rotated. Further, each electrode has a rectangular, preferably square main surface. The main surfaces of the electrodes 16, 17 oppose each other in parallel relation. The gold bonding wire 2 is clamped between the main surfaces of the electrodes 16, 17, and a fixed electrical potential is applied to the gold bonding wire by these electrodes. A heater 20 is incorporated in the movable plate 14 to heat the electrode 17. Alternatively, the heater 20 may be incorporated in the fixed plate 12 or in both of the plates 12, 14. A spring 18 is connected between the movable plate 14 and the shaft 11 to adjust the movement of the movable plate 14.

A method of bonding the gold bonding wire with the above-mentioned wire bonder, is explained below.

For connection of the pad on a semiconductor chip to the pad on a circuit board with the gold bonding wire, first, a gold ball 2a is formed at the tip of the gold bonding wire 2 as it exits the end of the capillary 6. At this time, the movable plate 14 is moved toward the fixed plate 12 by the solenoid 15 so as to clamp the gold bonding wire 2 by the electrodes 16, 17. The gold bonding wire 2 can be clamped anywhere on the surfaces of the electrodes 16, 17. That is, it is not required to adjust the location where the gold bonding wire 2 is placed. Then, by applying a particular electrical potential between the electrodes 16, 17 and the torch rod 7, a melted gold ball is formed at the tip of the gold bonding wire 2 by an atmospheric discharge against the gold bonding wire 2. Then, the gold ball 2a is solidified as it cools down after the application of the voltage is halted.

After the gold ball 2a is solidified, the electrodes 16, 17 release the gold bonding wire 2 by moving the movable plate 14 away from the fixed plate 12. Then, the tip of the capillary 6 presses the gold ball 2a against the pad on the circuit board by moving the transducer 5. The gold ball 2a is compressed against the pad. Then, the capillary 6 is vibrated ultrasonically by the transducer 5 so that the ultrasonic vibration is transmitted to the gold ball 2a. Further, the electrode 17 is heated by the heater 20, and the heat is transmitted to the gold ball 2a. Accordingly, the gold ball 2a at the end of the gold bonding wire is bonded to the pad on the circuit board by ultrasonic thermocompression.

After the gold bonding wire 2 has been connected at its tip to the pad on the circuit board, the capillary 6 is moved to a position above the pad on the semiconductor chip. Then, the gold bonding wire 2 is pressed by the tip of capillary 6 against the pad. Then, the capillary 6 is vibrated ultrasonically by the transducer 5, and the ultrasonic vibration is transmitted to the gold bonding wire 2. Further, the electrode 17 is heated by the heater 20, and the heat is transmitted to the gold bonding wire 2. Accordingly, the gold bonding wire 2 is bonded to the pad on the semiconductor chip by ultrasonic thermocompression so that the pads are connected so as to make a looping with the gold bonding wire 2.

Figure 1B:
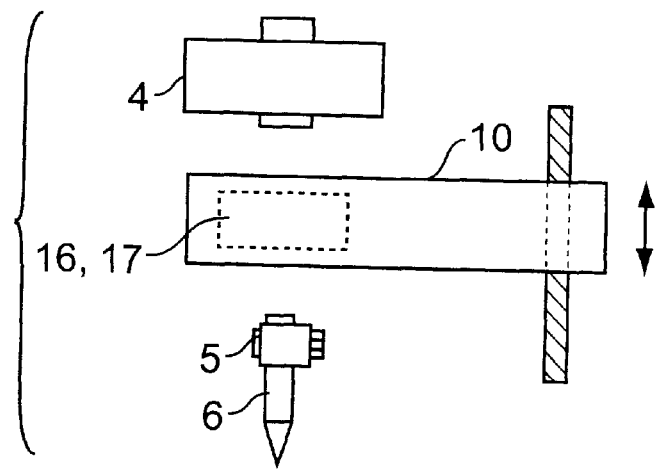
FIG. 1B is an enlarged side view of a cut clamper.

After the connection has been completed, the gold bonding wire 2 is clamped by the clamping electrodes 16, 17. Referring to FIG. 1B, then, by moving the cut clamper 10 toward away from the pad on the chip, the gold bonding wire 2 is cut by tension. The electrodes 16, 17 are rotated 90 degrees by the screws 19a, 19b if the main surfaces of the electrodes 16, 17 are worn because of the repetition of the above-described operations.

According to the first embodiment of the invention, the following advantages can be obtained.

Figure 3:
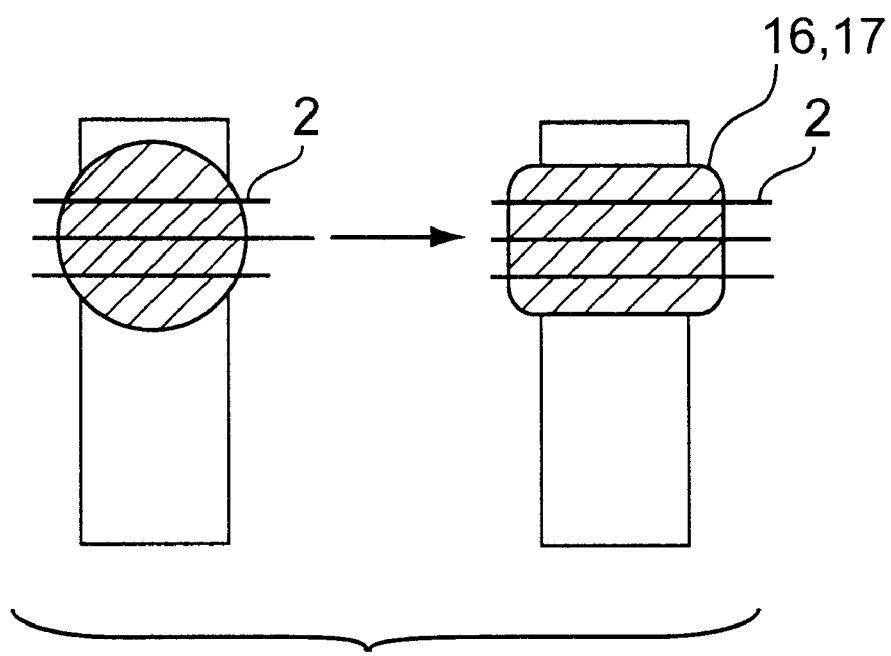
FIG. 3 is an enlarged detail illustration showing the relationship between a clamping electrode and a gold bonding wire in the related art and the first embodiment of the invention.

As shown in FIG. 3, the gold bonding wire 2 should always be put through the center of the disk-shaped electrode in the conventional device to keep the gold bonding wire 2 contacting the electrode 16, 17 uniform in length. However, it is not necessary to put the gold bonding wire 2 through the center of the electrodes 16, 17 in this embodiment because the main surface of the electrode is rectangular. Therefore, as the length of the gold bonding wire 2 which contacts the electrodes 16, 17 is invariable, an electrical potential which is consistently the same atmospheric discharge can be applied. Thus, a gold ball that is consistently same size can be formed. Further, as it is not necessary to adjust the location of the gold bonding wire on the electrodes precisely, it becomes easy to control the clamping movement of the movable plate 14 and the fixed plate 12.

In the conventional device, when a worn electrode is replaced to a new one, it is necessary to place the new electrodes in parallel very precisely. However, where the main surfaces of the rotatable electrodes 16, 17 are square, the gold bonding wire 2 can be clamped with fresh surfaces of the electrodes 16, 17 by rotating the electrodes by 90 degrees, and moreover, the frequency of electrode replacement can be reduced.

Furthermore, as the gold bonding wire 2 is heated by the heater 10 when the atmospheric discharge is performed, the gold ball can consistently be formed with the same hardness. Additionally, because the gold bonding wire 2 can be heated directly by the electrode 17, various kinds of the connection-specification of the gold bonding wire 2, e.g. a wire loop height, can be controlled by heat. Therefore, a stable looping connection can be performed.

Figure 4:
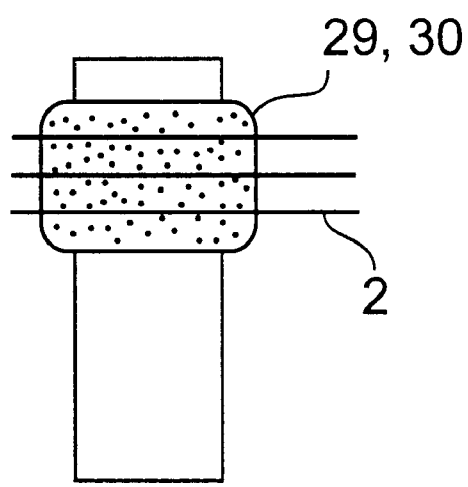
FIG. 4 is an alternative clamping electrode of the first embodiment of the invention.

Referring to FIG. 4, alternative clamping electrodes 29 30 can be used in the wire bonder 100. Many microprojections such as sandpaper, are formed on the surfaces of the electrodes 29, 30. The microprojections prevent the gold bonding wire 2 from slipping on the electrode surfaces. As the distance from the tip of the gold bonding wire 2 to the edge of the electrodes 29, 30 is always the same, the gold ball which is consistently same size can be formed.

Referring to FIG. 5, a wire bonder 200 according to the second embodiment of the invention has a spool unit 31 in which a spool 31a is set, a gold bonding wire guide 33, a pipe-shaped air damper 34 having a hole 34a, a transducer 35, a capillary 36 having a center hole 36a, a torch rod 37, and a cut damper unit 40 that includes of a first cut damper 38 and a second cut damper 39. A gold bonding wire 32 is spooled on the spool 31a. The cut damper unit 40 can be moved toward the spool unit 31. As the parts of the wire bonder 200 other than the cut damper unit 40 are the same as in the wire bonder 100, the description of the second embodiment is focused on the cut damper unit 40, which replace the cut damper 10. Referring to FIG. 6(II), the cut clamper unit 40 is disposed between the pipe-shaped air clamper 34 and the transducer 35. Referring to FIG. 7(III), the first cut damper 38 has the same structure as the cut damper 10 of the first embodiment. That is, the first cut damper 38 has a first fixed plate 38b which is fixed to a shaft 41, and a first movable plate 38a that is fixed to an elastic shaft 43 that can expand and contract. The first fixed plate 38b and the first movable plate 38a are disposed in parallel. A distance between the first fixed plate 38b and the first movable plate 38a can be changed using a solenoid 45 to move the first movable plate 38a toward and away from the first fixed plate 38b. The first cut damper 38 has a pair of clamping electrodes 38c, 38d made of cermet. The electrode 38d is connected to the first fixed plate 38b by a screw 50b and the electrode 38c is connected to the first movable plate 38a by a screw 50a. Therefore, the electrodes 38c, 38d can be rotated. Further, each electrode has a rectangular main surface, that is, preferably square. The main surfaces of the electrodes 38c, 38d oppose each other in parallel relation. The gold bonding wire 32 is clamped between the main surfaces of these electrodes. A heater 49 is incorporated in the first movable plate 38a to heat the electrode 38c. Alternatively, the heater 49 may be incorporated in the first fixed plate 38b or heaters may be incorporated in both of the first fixed plate 38b and the first movable plate 38a. A spring 48 is connected between the first movable plate 38a and the shaft 41 to adjust the movement of the first movable plate 38a.

Referring to FIG. 8(IV), the second cut damper 39 has a second fixed plate 39b that is fixed to a shaft 141, and a second movable plate 39a that is fixed to a elastic shaft 143 that can expand and contract. The second fixed plate 39b and the second movable plate 39a oppose each other in parallel relation. The distance between the second fixed plate 39b and the second movable plate 39a can be changed by activating a solenoid 145. As the result, the second movable plate 39a can be moved toward and away from the second fixed plate 39b. The second cut clamper 39 also has a pair of metal plate 39c, 39d, preferably made of cermet. The metal plate 39d is connected to the second fixed plate 30b by a screw 150b, and the metal plate 39c is connected to the second movable plate 39a by a screw 150a. Therefore, the metal plates 39c, 39d can be rotated. Further, each metal plate has a rectangular, preferably square, main surface that opposes the other in parallel relation. The gold bonding wire 32 is clamped between these main surfaces. A spring 148 is connected between the second movable plate 39a and the shaft 141 to adjust the movement of the movable plate 39a.

A method of bonding the gold bonding wire with the above-described wire bonder 200 is explained below.

For connection of the pad on a semiconductor chip to the pad on a circuit board with the gold bonding wire, first, a gold ball 32a is formed at the tip of the gold bonding wire 32 as it exits the end of the capillary 36. At this time, the first movable plate 38a is moved toward the first fixed plate 38b by the solenoid 45 so as to clamp the gold bonding wire 32 by the electrodes 38c, 38d. The gold bonding wire 32 can be clamped anywhere on the surfaces of the electrodes 38c, 38d. That is, it is not required to adjust the location where the gold bonding wire 32 is placed. Then, by applying a particular electrical potential between the electrodes 38c, 38d and the torch rod 37, a melted gold ball is formed by an atmospheric discharge against the gold bonding wire 32. Then, the gold ball 32a is solidified as it cools down after the application of the voltage is halted.

After the gold ball 2a is solidified, the electrodes 38c, 38d release the gold bonding wire 32 by moving the first movable plate 38a away from the first fixed plate 38b. Then, the tip of the capillary 36 presses the gold ball 32a against the pad on the circuit board by moving the transducer 35. The gold ball 32a is compressed against the pad. Then, the capillary 36 is vibrated ultrasonically by the transducer 35 so that the ultrasonic vibration is transmitted to the gold ball 32a. Further, the electrode 38c is heated by the heater 49, and the heat is transmitted to the gold ball 32a. Accordingly, the gold ball 32a at the end of the gold bonding wire 32 is bonded to the pad on the circuit board using ultrasonic thermocompression.

After the gold bonding wire 32 has been connected at its tip to the pad on the circuit board, the capillary 36 is moved to a position above the pad on the semiconductor chip. Then, the gold bonding wire 32 is pressed by the tip of capillary 36 against the pad, Then, the capillary 36 is vibrated ultrasonically by the transducer 35, and the ultrasonic vibration is transmitted to the gold bonding wire 32. Further, the electrode 38c is heated by the heater 20, and the heat is transmitted to the gold bonding wire 32. Accordingly, the gold bonding wire 32 is bonded to the pad on the semiconductor chip by ultrasonic thermocompression so that the pads are connected so as to make a looping with the gold bonding wire 32.

After the connection has completed, the second movable plate 39a is moved toward the second fixed plate 39b by the solenoid 145 so as to clamp the gold bonding wire 32 by the metal plates 39c, 39d. Then, by moving the second cut clamper 39 toward away from the pad on the chip, the gold bonding wire 32 is cut by tension. The electrodes 38c, 38d or the metal plates 39c, 39d are rotated 90 degrees by the screws 19a, 19b if the main surfaces of the electrodes 38c, 38d or the main surface of the metal plates 39c, 39d are worn because of the repetition of the above-described operations.

According to the second embodiment of the invention, the following advantages can be obtained. In this second embodiment, the first cut damper 38 is used for applying voltage to get the atmospheric discharge, and the second cut damper 39 is used for cutting the gold bonding wire 32. That is, as the first cut damper 38 and the second cut damper 39 can be changed by the purpose of the use, the stable looping connection can be performed and a gold ball which is consistently same size can be formed.

Abrasion on the main surface of the electrodes 38b, 38d by the atmospheric discharge and abrasion on the main surface of the metal plates 39b, 39d by slipping the gold bonding wire, have different proprieties. However, in this embodiment, as the first cut damper 38 receives a influence of the atmospheric discharge only, and as the second cut damper 39 receives a influence of the slipping the gold bonding wire, it is easy to control the maintenance.

Furthermore, the alternative clamping electrodes 29, 30 which are shown in FIG. 4 can be used as the metal plates in the wire bonder 200.

In addition, it may be allowed that the first cut damper 38 is disposed between the second cut damper 39 and transducer 35.

While the present invention has been described with reference to illustrative embodiments, this description is not intended to be construed in a limiting sense. Various modifications of the illustrated embodiments, as well as other embodiments of the invention, will be apparent to those skilled in the art on reference to this description. It is therefore contemplated that the appended claims will cover any such modifications or embodiments as falls within the true scope of the invention.

What I claim is:

1. A method for bonding a wire comprising:

moving a second clamping electrode toward a first clamping electrode so as to clamp a bonding wire;

forming a melted ball at a tip of the bonding wire by an atmospheric discharge against the bonding wire;

solidifying the melted ball;

releasing the bonding wire by moving the second clamping electrode away from the first clamping electrode; and bonding the melted ball of the boding wire to a pad on a circuit board;

wherein the first and second clamping electrodes having rectangular main surface.

2. A method of wire-bonding between a pad on a semiconductor chip and a pad on a circuit board on which the semiconductor device is mounted comprising:

clamping a wire between a pair of clamping electrodes, each having a rectangular main surface;

applying a first electric potential to the wire with a torch rod;

applying a second electric potential directly to the wire with the clamping electrodes, so as to form a melted ball at a tip of the wire;

solidifying the melted ball;

unclamping the wire;

pressing the solidified ball with a capillary against the pad on the circuit board;

vibrating the wire ultrasonically to bond the solidified ball to the pad of the circuit board;

moving the wire whose tip is bonded to the pad of the circuit board, with the capillary on the pad of the semiconductor chip;

vibrating the wire ultrasonically to bond the wire to the pad of the semiconductor chip; and wherein the pad on the circuit board is connected to the pad of the semiconductor chip with the wire;

clamping the wire between the clamping electrodes again, and moving the clamping electrodes away from the pad of the semiconductor chip so as to snap the wire adjacent to the pad of the semiconductor chip.

3. A method of wire-bonding as claimed in claim 2, wherein the rectangular main surface is a square main surface.

4. A method of wire-bonding as claimed in claim 3, further comprising, rotating one of or both clamping electrodes by 90 degrees after moving the clamping electrodes away from the pad of the semiconductor chip so as to snap the wire adjacent to the pad of the semiconductor chip.

5. A method of wire-bonding as claimed in claim 2, wherein each clamping electrode has an uneven surface.

6. A method of wire-bonding as claimed in claim 2, wherein each clamping electrode has many microprojections on its surface.

7. A method of wire-bonding as claimed in claim 2, further comprising, heating the wire by applying a heater when the first and the second potentials are applied to the wire.

8. A method of wire-bonding between a pad on a semiconductor chip and a pad on the board on which the semiconductor device is mounted, comprising:

clamping a wire between a pair of clamping electrodes, each having a rectangular main surface;

applying a first electric potential to the wire by a torch rod;

applying a second electric potential directly to the wire by the clamping electrodes, so as to form a melted ball at a tip of the wire;

solidify the melted ball;

unclamping the wire;

pressing the solidified ball with a capillary against the pad on the circuit board;

vibrate the wire ultrasonically to bond the solidified ball to the pad of the circuit board;

moving the wire whose tip is bonded to the pad of the circuit board, with the capillary on the pad of the semiconductor chip;

vibrating the wire ultrasonically to bond the wire to the pad of the semiconductor chip; and wherein the pad on the circuit board is connected to the pad of the semiconductor chip with the wire;

clamping the wire by a pair of plates, and moving the plates away from the pad of the semiconductor chip so as to snap the wire adjacent to the pad of the semiconductor chip.

9. A method of wire-bonding as claimed in claim 8, wherein the rectangular main surface is a square main surface.

10. A method of wire-bonding as claimed in claim 9, further comprising, rotating one of or both clamping electrodes and/or one of or both plates by 90 degrees after moving the plates away from the pad of the semiconductor chip so as to snap the wire adjacent to the pad of the semiconductor chip.

11. A method of wire-bonding as claimed in claim 8, wherein each plate has an uneven surface.

12. A method of wire-bonding as claimed in claim 9, wherein each plate has many microprojections on its surface.

13. A method of wire-bonding as claimed in claim 8, further comprising, heating the wire by applying a heater when the first and the second potentials are applied to the wire.

* * * * *